May 10, 1966 A. VAN COUVERING ETAL 3,249,982

SEMICONDUCTOR DIODE AND METHOD OF MAKING SAME

Filed Jan. 7, 1963

Alan VanCouvering
Howard H. Luckey,
INVENTORS.
BY.
Walter R. Thiel
ATTORNEY.

United States Patent Office 3,249,982
Patented May 10, 1966

3,249,982
SEMICONDUCTOR DIODE AND METHOD OF MAKING SAME

Alan Van Couvering, Brea, and Howard H. Luckey, Long Beach, Calif., assignors to Hughes Aircraft Company, Culver City, Calif., a corporation of Delaware
Filed Jan. 7, 1963, Ser. No. 249,644
4 Claims. (Cl. 29—25.3)

Figure 1:
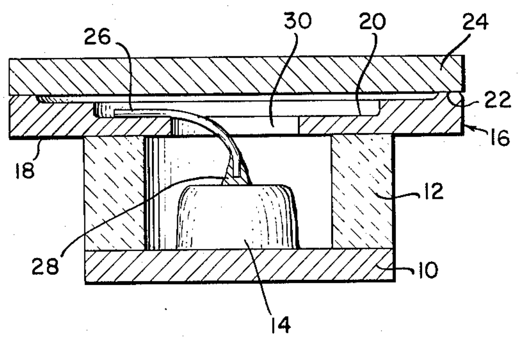

This invention relates to semiconductor diodes and in particular to packages for diodes useful at high frequencies and especially suited for microwave usage, and to a method of making and packaging the device.

One example of diodes particularly useful at high frequencies is the tunnel diode which is a semiconductor device consisting of a P-type region and an N-type region each region having an electrode affixed thereto. Both regions contain very high doping of impurity concentration and in addition the chemical transition from the N-type to the P-type region is quite abrupt. Impurity concentration in tunnel diodes is typically in the order of from $10^{19}$ to $10^{21}$ atoms per cubic centimeter while the thickness of the P-N junction is typically about $10^{-6}$ centimeters. The tunnel diode is normally provided in a package containing the diode, the electrodes, and a protective case surrounding the assembly.

In the manufacture of small area diodes, which is herein taken to include alloy contact, pulse bonded, and etched mesa semiconductor diodes, a package suitable for microwave stripline assembly is highly desirable for high frequency applications and requires short effective electrode leads, package size uniformity, and physical as well as electrical stability and reliability. In achieving these requriments several methods are utilized in the semiconductor industry to package diodes. One prior art device is shown and described in U.S. Patent No. 3,030,557 to George Dermit, issued April 17, 1962. This device includes a rigid bridge member having a centrally located contact portion and at least two rigid lead arms to make electrical contact to a metallic dot alloyed into a highly doped semiconductor wafer and includes the method of encapsulating the diode in a layer of insulating epoxy and a layer of conducting epoxy. Another device includes the method of encapsulating the device in layers of insulating and conducting epoxy but includes instead of a rigid contact a wire lead to provide electrical contact to the semiconductor body.

Therefore, an object of this invention is to provide an improved package for small area diodes or other semiconductor devices which reduces actual stresses on the junction of the device.

Another object of this invention is to provide a standardized package equally suitable for pulse bonded junction diodes, alloy or diffused junction diodes and point contact diodes which requires no insulating or conducting resins.

A further object of this invention is an improved point contact diode which obviates point contact or junction failure.

A still further object of this invention is an improved method of manufacture of small area diodes to provide a highly reliable easily handled package structure.

Briefly, a semiconductor device in accordance with the present invention comprises a semiconductor body including a lead positioned in a package including electrodes having parallel surfaces, an annular insulating ring bonded to a base electrode, and a support ring bonded between the other electrode and the insulating ring and having the lead bonded to it. Also, the present invention provides an improved method of packaging small area diodes which comprises the steps of positioning a semiconductor body and an insulating ring on a first or base electrode in a manner so that the ring surrounds said body, positioning a support ring on said insulating ring, bonding the resultant assembly into a rigid unit, welding a lead having an alloy coated tip to said support ring so that the tip is in contact with said body, forming a junction between the alloy and the body, and welding a second or cap electrode to said support ring.

Figure 2:
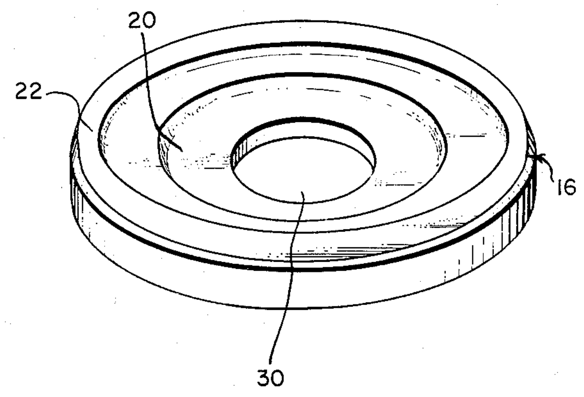

These and other objects and advantages will be apparent from the following description taken in accordance with the drawings throughout which like reference characters indicate like parts, and in which:

FIGURE 1 is a cross-sectional view in elevation of one embodiment of a small area diode package manufactured according to the present invention; and FIG. 2 is a sectional perspective view of the support ring shown in the embodiment of the device of FIG. 1.

Referring to FIG. 1 there is shown: a Kovar base electrode disc 10 which is preferably plated on both major surfaces (not shown) with gold including a P-type dopant such as 1% zinc or antimony; together with an insulating ring 12 of alumina ceramic insulating material which is metallized on opposite ends with molybdenum manganese alloy and then gold plated; a die 14 of gallium-arsenide semiconductor crystal which may be chemically etched if desired, for example, to form a specular upper surface; and a Kovar support ring 16. The support ring 16 has a diameter greater than that of the base 10 and the insulating ring 12 to provide a lip 18 for facilitating the handling of the device and the positioning of it in jigs at pressures that would destroy the device if applied to the ceramic insulating ring 12. The ring 16 includes an annular ridge 22 near the periphery of the ring having a width sufficient to support a Kovar second or cap electrode 24 of the same diameter as the ring 16 and an annular support shoulder 20 which has a height and width of a dimension sufficient to enable a lead 26 coupled to the junction to be welded on the shoulder without it extending above the height of the shoulder 20. Both the support ring 16 and the second electrode 24 are plated on one major surface (not shown) with P-type doped gold in the same fashion as the base electrode 10. Alternatively other semiconductor crystal materials such as germanium, gallium antimonide and the like may be used with suitably selected impurity or dopant materials. The lead 26 is a flexible wire of a material such as platinum and typically has a diameter of 0.001 inch and a length of 0.010 inch and includes a tip sharpened to a .002 inch point and a coating 28 of a suitable N-type dopant such as tin or tellurium. A wire lead of such size provides negligible inductance.

To assemble the package, the base 10, insulating ring 12, die 14, support ring 16 are assembled as shown in FIG. 1, and are bonded in a suitable furnace at about 650° C. and the semiconductor die 14 is chemically etched if desired to an appropriate configuration. Electro-etching in 5% KOH at room temperature at approximately 20 milliamps is suitable. While under optimum temperatures the support ring 16 may properly bond to the insulating ring 12, it has been found desirable to insure proper wetting of the bonding surfaces that a slurry of gallium arsenide be used betwen the bonding surfaces. The junction may be formed by the conventional pulse bonding process, or by the conventional alloy contacting process or a die containing a conventional diffused junction with etched mesa may be used. In each case an N-type zone is formed in the P-type gallium-arsenide crystal. Since these junction techniques are widely known in the art they will not be described. After the junction is formed it may be desirable to reduce the area of the junction. This is done by a conventional etching technique which is greatly facilitated since the junction is readily accessible through the aperture 30 in the support ring 16. The junction area may be typically about .001 inch in diameter or less, however, the desired area for a particular small area diode is determined from measurements of the diode capacitance and peak current. After etching, the diode is encapsulated by positioning the Kovar second electrode 24 on the annular ridge 22 and welding it thereto by conventional welding techniques. The annular ridge 22 is included in the structure of the support ring 16 to concentrate the energy of the weld at the outer edge of the support ring 16 and the second electrode 24 thereby minimizing undesirable thermal effects on the junction. In addition, the support shoulder 20 is of a sufficient height to receive the lead 26 so that it is not disturbed when the second electrode 24 is positioned on the package.

Since the alloy tipped lead 26 is welded in place after the basic portion of the package is bonded at a high temperature, the unit can be used with a wide choice of alloys and with alloying temperatures ranging up to a temperature approaching the bonding temperature of the basic unit. In addition, when a pulse bonding technique is used for the forming of the junction a wire or lead of the alloy itself may be used.

Since the package has been assembled without the use of epoxies the effect of the chemical characteristics and force transmission properties of the epoxy on the junction have been eliminated. In addition, since the electrical contact to the diode has been provided by a flexible wire instead of a rigid bridge the transmission of forces to the junction by the contact is minimized.

To produce N and P type regions opposite to those illustrated and discussed a tin or tellurium doped gallium arsenide crystal may be used for the crystal die 14 and the wire or lead 26 may be zinc coated at its tip to produce a P-type contact zone on the N-type crystal.

While one embodiment of this invention has been herein illustrated it will be appreciated by those skilled in the art that variations of the disclosed arrangement both as to its details and as to the organization of such details may be made without departing from the spirit and scope thereof. Accordingly, it is intended that the foregoing disclosure and the showings made in the drawings shall be considered as illustrative of the principles of this invention and not construed in a limiting sense.

What is claimed is:

1. The method of packaging a semiconductor device having a base and a cap electrode, a semiconductor body, an insulating ring, a support ring, and a lead having a dopant coated tip, comprising the steps of:

positioning the semiconductor body and the insulating ring on the base electrode with the ring surrounding the body;
positioning the support ring on the insulating ring;
bonding the resultant assembly into a rigid unit;
welding the lead to the support ring with the tip in contact with the body;
forming a junction in the body; and
welding the cap electrode to the support ring to provide a hermetically sealed package.

2. The method of packaging a semiconductor device having a base and a cap electrode, a semiconductor body, an alumina ring having metallized end surfaces, a support ring, and a lead having an alloy coated tip, comprising the steps of:

positioning the semiconductor body and the alumina ring on the base electrode with one of the metallized surfaces in contact therewith and with the ring surrounding the body;
positioning the support ring on the other metallized surface of the alumina ring;
bonding the resultant assembly into a rigid unit;
welding the lead to the support ring with the tip in contact with the body;
forming a junction in the body; and
welding the cap electrode to the support ring to provide a hermetically sealed package.

3. The method of packaging a semiconductor device having a base and a cap electrode, a semiconductor body, an alumina ring having metallized end surfaces, a support ring, and a lead having an alloy coated tip, comprising the steps of:

positioning the semiconductor body and the alumina ring on the base electrode with one of the metallized surfaces in contact therewith and with the ring surrounding the body;
coating the other metallized surface of the alumina ring with gallium arsenide slurry;
positioning the support ring on the surface of the alumina ring having the gallium arsenide slurry;
bonding at a high temperature the resultant assembly into a rigid unit;
welding the lead to the support ring with the tip in contact with the body;
forming a junction in the body; and
welding the cap electrode to the support ring to provide a hermetically sealed package.

4. The method of packaging a semiconductor device having a base and a cap electrode, a semiconductor body, an insulating ring, a support ring, and a lead having a dopant coated tip, comprising the steps of:

positioning the semiconductor body and the insulating ring on the base electrode with the ring surrounding the body;
positioning the support ring on the insulating ring;
bonding the resultant assembly into a rigid unit;
etching the exposed surfaces of the body;
welding the lead to the support ring with the tip thereof in contact with the body;
forming a junction in the body;
etching the junction to reduce the area thereof; and
welding the cap electrode to the support ring to provide a hermetically sealed package.

References Cited by the Examiner

UNITED STATES PATENTS

| | | | |
|---|---|---|---|
| 2,699,594 | 1/1955 | Bowne | 29—25.3 |
| 2,832,016 | 4/1958 | Bakalar | 29—25.3 |
| 2,932,684 | 4/1960 | Hales et al. | 174—50.5 |
| 2,939,204 | 6/1960 | Knott et al. | 29—25.3 |
| 3,001,113 | 9/1961 | Mueller | 29—25.3 |
| 3,024,299 | 3/1962 | Nijhuis et al. | 174—50.5 |
| 3,110,080 | 11/1963 | Boyer et al. | 29—25.3 |

RICHARD H. EANES, Jr., *Primary Examiner.*

DONELL L. CLAY, *Examiner.*

W. B. FREDRICKS, *Assistant Examiner.*